(12) United States Patent
Kraft et al.

(10) Patent No.: US 9,818,724 B2
(45) Date of Patent: Nov. 14, 2017

(54) INTERPOSER-CHIP-ARRANGEMENT FOR DENSE PACKAGING OF CHIPS

(71) Applicant: ams AG, Unterpremstaetten (AT)

(72) Inventors: Jochen Kraft, Bruck an der Mur (AT); Martin Schrems, Eggersdorf (AT); Franz Schrank, Graz (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 14/561,164

(22) Filed: Dec. 4, 2014

(65) Prior Publication Data
US 2015/0162308 A1 Jun. 11, 2015

Related U.S. Application Data
(60) Provisional application No. 61/912,114, filed on Dec. 5, 2013.

(30) Foreign Application Priority Data
Dec. 20, 2013 (EP) .................................. 13198854

(51) Int. Cl.
*H01L 23/495* (2006.01)
*H01L 25/065* (2006.01)
(Continued)

(52) U.S. Cl.
CPC ...... *H01L 25/0655* (2013.01); *H01L 21/6835* (2013.01); *H01L 23/481* (2013.01);
(Continued)

(58) Field of Classification Search
CPC ........... H01L 25/0655; H01L 23/49838; H01L 21/486; H01L 23/49827; H01L 25/50;
(Continued)

(56) References Cited

U.S. PATENT DOCUMENTS

| 5,629,534 A | 5/1997 | Inuzuka et al. |
| 6,376,917 B1* | 4/2002 | Takeshita ............ H01L 23/5386 257/778 |

(Continued)

FOREIGN PATENT DOCUMENTS

| CN | 101936752 A | 1/2011 |
| CN | 102364358 A | 2/2012 |

(Continued)

OTHER PUBLICATIONS

Murugesan, M. et al., "High-step-coverage Cu-lateral interconnections over 100 μm thick chips on a polymer substrate—an alternative method to wire bonding", Journal of Micromechanics and Microengineering, vol. 22, 2012, pp. 1-9.

(Continued)

*Primary Examiner* — Phat X Cao
*Assistant Examiner* — Mohammad M Hoque
(74) *Attorney, Agent, or Firm* — McDermott Will & Emery LLP (57) ABSTRACT

The interposer-chip-arrangement comprises an interposer (1), metal layers arranged above a main surface (10), a further metal layer arranged above a further main surface (11) opposite the main surface, an electrically conductive interconnection (7) through the interposer, the interconnection connecting one of the metal layers and the further metal layer, a chip (12) arranged at the main surface or at the further main surface, the chip having a contact pad (15), which is electrically conductively connected with the interconnection, a dielectric layer (2) arranged above the main surface with the metal layers embedded in the dielectric layer, a further dielectric layer (3) arranged above the further main surface with the further metal layer embedded in the further dielectric layer, and an integrated circuit (25) in the (Continued)

interposer, the integrated circuit being connected with at least one of the metal layers (5).

3 Claims, 8 Drawing Sheets (51) Int. Cl.
*H01L 23/48* (2006.01)
*H01L 23/00* (2006.01)
*H01L 25/00* (2006.01)
*H01L 21/683* (2006.01)
*H01L 21/56* (2006.01)
*H01L 21/48* (2006.01)
*H01L 23/498* (2006.01)
*H01L 23/14* (2006.01)
*H01L 23/538* (2006.01)

(52) U.S. Cl.
CPC ........ *H01L 23/49838* (2013.01); *H01L 24/24* (2013.01); *H01L 24/82* (2013.01); *H01L 24/92* (2013.01); *H01L 24/94* (2013.01); *H01L 24/96* (2013.01); *H01L 24/97* (2013.01); *H01L 25/0652* (2013.01); *H01L 25/0657* (2013.01); *H01L 25/50* (2013.01); *H01L 21/486* (2013.01); *H01L 21/568* (2013.01); *H01L 23/147* (2013.01); *H01L 23/49827* (2013.01); *H01L 23/5389* (2013.01); *H01L 24/29* (2013.01); *H01L 24/32* (2013.01); *H01L 24/48* (2013.01); *H01L 24/73* (2013.01); *H01L 24/85* (2013.01); *H01L 2221/68372* (2013.01); *H01L 2224/02372* (2013.01); *H01L 2224/0401* (2013.01); *H01L 2224/04042* (2013.01); *H01L 2224/0557* (2013.01); *H01L 2224/05548* (2013.01); *H01L 2224/06181* (2013.01); *H01L 2224/13024* (2013.01); *H01L 2224/1403* (2013.01); *H01L 2224/16145* (2013.01); *H01L 2224/16147* (2013.01); *H01L 2224/16225* (2013.01); *H01L 2224/16227* (2013.01); *H01L 2224/24146* (2013.01); *H01L 2224/24147* (2013.01); *H01L 2224/2919* (2013.01); *H01L 2224/32145* (2013.01); *H01L 2224/48145* (2013.01); *H01L 2224/73253* (2013.01); *H01L 2224/73259* (2013.01); *H01L 2224/73265* (2013.01); *H01L 2224/73267* (2013.01); *H01L 2224/82005* (2013.01); *H01L 2224/82031* (2013.01); *H01L 2224/83005* (2013.01); *H01L 2224/85005* (2013.01); *H01L 2224/9222* (2013.01); *H01L 2224/92242* (2013.01); *H01L 2224/92244* (2013.01); *H01L 2224/92247* (2013.01); *H01L 2224/94* (2013.01); *H01L 2224/97* (2013.01); *H01L 2225/06506* (2013.01); *H01L 2225/06524* (2013.01); *H01L 2225/06544* (2013.01); *H01L 2225/06568* (2013.01); *H01L 2924/00014* (2013.01); *H01L 2924/157* (2013.01); *H01L 2924/15153* (2013.01); *H01L 2924/15311* (2013.01); *H01L 2924/15331* (2013.01)

(58) Field of Classification Search
CPC ......... H01L 24/97; H01L 24/24; H01L 24/96; H01L 24/94; H01L 24/92; H01L 24/82; H01L 24/85; H01L 24/29; H01L 24/48; H01L 24/73; H01L 24/32

USPC .......................................... 438/123; 257/676
See application file for complete search history.

(56) References Cited

U.S. PATENT DOCUMENTS

| 6,486,467 | B1 | 11/2002 | Speckbacher et al. | |
|---|---|---|---|---|
| 7,030,359 | B2 | 4/2006 | Romhild | |
| 7,453,079 | B2 | 11/2008 | Sano | |
| 7,683,449 | B2 | 3/2010 | Minixhofer | |
| 8,212,202 | B2 | 7/2012 | Wong et al. | |
| 8,803,206 | B1* | 8/2014 | Or-Bach ............ | H01L 25/0657 257/278 |
| 8,928,159 | B2* | 1/2015 | Chang et al. ........ | 257/797 |
| 2006/0043606 | A1* | 3/2006 | Imaoka et al. ....... | 257/780 |
| 2007/0007641 | A1 | 1/2007 | Lee et al. | |
| 2008/0097172 | A1 | 4/2008 | Sawada et al. | |
| 2010/0127296 | A1 | 5/2010 | Hioki et al. | |
| 2010/0171226 | A1 | 7/2010 | West et al. | |
| 2010/0258710 | A1 | 10/2010 | Wiese et al. | |
| 2011/0024887 | A1* | 2/2011 | Chi ..................... | H01L 21/568 257/684 |
| 2011/0024916 | A1 | 2/2011 | Marimuthu et al. | |
| 2011/0089531 | A1* | 4/2011 | Hillman et al. ...... | 257/532 |
| 2011/0186998 | A1* | 8/2011 | Wu et al. ............. | 257/738 |
| 2012/0056312 | A1 | 3/2012 | Pagaila et al. | |
| 2012/0086131 | A1* | 4/2012 | Wang .................. | H01L 21/563 257/774 |
| 2012/0182066 | A1* | 7/2012 | Merkle ............... | H05K 1/0243 327/564 |
| 2013/0001398 | A1 | 1/2013 | Wada et al. | |
| 2013/0009173 | A1 | 1/2013 | Vittu et al. | |
| 2016/0284920 | A1 | 9/2016 | Saugier et al. | |

FOREIGN PATENT DOCUMENTS

| CN | 102738132 A | 10/2012 |
| DE | 3633181 A1 | 4/1988 |
| JP | 2002-170984 A | 6/2002 |
| JP | 2006203111 A | 8/2006 |
| JP | 2007199328 A | 8/2007 |
| JP | 2010034189 A | 2/2010 |
| WO | 2011/097089 A2 | 8/2011 |

OTHER PUBLICATIONS

Qianwen, C. et al., "Chip-to-Wafer (C2W) 3D Integration with Well-Controlled Template Alignment and Wafer-Level Bonding", Electronic Components and Technology Conference (ECTC), 2011 IEEE 61st , pp. 1-6.
Shigetou, A. et al., "Homo/Heterogeneous Bonding of Cu, SiO2, and Polyimide by Low Temperature Vapor-Assisted Surface Activation Method", Electronic Components and Technology Conference (ECTC), 2011 IEEE 61st, pp. 32-36.
Weelden, T. et al., "The Encapsulation of MEMS/Sensors and the realization of Molded Vias on Package Level and Wafer Level With Film Assisted Molding", 7th Annual International Wafer-Level Packaging Conference & Tabletop Exhibition 2010 (IWLPC 2010), Santa Clara, California, USA, Oct. 10-14, 2010, pp. 22-27.
"Conventional transfer molding" Advanced Molding Systems, Boschman Technologies, last retrieved Jan. 27, 2014 from http://www.boschman.nl/index.php/molding-principles/conventional-transfer-molding.html.
"Film-Assisted Molding (FAM) technologies", Advanced Molding Systems, Boschman Technolgoies, last retrieved Jan. 27, 2014 from http://www.boschman.nl/index.php/molding-principles/film-assisted-molding.html.

* cited by examiner

INTERPOSER-CHIP-ARRANGEMENT FOR DENSE PACKAGING OF CHIPS

CROSS-REFERENCE TO RELATED APPLICATIONS

The present application claims the benefit of priority under 35 U.S.C. §119 from U.S. Provisional Patent Application Ser. No. 61/912,114, filed on Dec. 5, 2013, and claims priority to European Patent Application No. 13198854.5 filed on Dec. 20, 2013, both disclosures of which are hereby incorporated by reference in their entirety for all purposes.

BACKGROUND OF THE INVENTION

1. Field of the Invention

The invention relates to an arrangement of a semiconductor chip and an interposer for dense packages in semiconductor technology.

2. Description of Related Art

Dense packaging of semiconductor chips is achieved by techniques that allow a compact arrangement of chips in a housing, like wafer-to-wafer or chip-to-wafer direct bonding. Through-silicon vias (TSVs), which are also called through-substrate vias in more general applications, and advanced wiring methods can also be used to reduce the dimensions.

US 2007/0007641 A1 discloses a chip-embedded interposer structure comprising a silicon substrate with a cavity, an integrated circuit chip with a plurality of I/O pads arranged in the cavity, a plurality of through-substrate vias penetrating the substrate and rerouting conductors connected to the I/O pads and the through-substrate vias.

US 2010/0171226 A1 discloses an IC with an array of TSVs, each TSV comprising an electrically conductive filler material surrounded by a dielectric liner. The TSVs are arranged in interior and exterior rows and columns. At least a portion of the TSVs are electrically connected to a terminating metal interconnect level. At least one of the exterior rows or columns includes a lower number of electrically connected TSVs than the interior rows and the interior columns.

US 2011/0024916 A1 discloses a method of forming an interposer package with through-silicon vias. A semiconductor die and a dummy die provided with a through-silicon via are mounted over a carrier, the dies are encapsulated, and the carrier is removed. A first redistribution layer is formed over the dies, thus electrically connecting the through-silicon via and a contact pad of the semiconductor die. An insulation layer is formed over the first redistribution layer. A second redistribution layer is formed opposite the first redistribution layer and electrically connected to the through-silicon via. A semiconductor package is connected to the second redistribution layer.

M. Murugesan et al., "High-step-coverage Cu-lateral interconnections over 100 μm thick chips on a polymer substrate—an alternative method to wire bonding," in J. Micromech. Microeng. 22 (2012) 085033 doi:10.1088/0960-1317/22/8/085033, describe a method for packaging different kinds of chips on a wafer level. The resistance value of high-step-coverage interconnections formed by electroplating over 100 μm thick silicon chips was found to be very close to the resistance value of interconnections on the plain wafer even at 150° C. The method is suggested for the manufacture of CMOS compatible interconnections between a polymer substrate and a chip.

Qianwen Chen et al., "Chip-to-Wafer (C2W) 3D Integration with Well-Controlled Template Alignment and Wafer-Level Bonding," in IEEE 61st Electronic Components and Technology Conference (ECTC 2011), describe the embedding of chips into cavities.

Akitsu Shigetou and Tadatomo Suga, "Homo/Heterogeneous Bonding of Cu, $SiO_2$, and Polyimide by Low Temperature Vapor-Assisted Surface Activation Method," in IEEE 61st Electronic Components and Technology Conference (ECTC 2011), describe polyimide bonding with thickness of 10 nm.

SUMMARY OF THE INVENTION

The interposer-chip-arrangement comprises an interposer having a main surface and a further main surface opposite the main surface, metal layers arranged above the main surface, a further metal layer arranged above the further main surface, an electrically conductive interconnection through the interposer, the interconnection connecting one of the metal layers and the further metal layer, a chip arranged at the main surface or at the further main surface, the chip having a contact pad, which is electrically conductively connected with the interconnection, a dielectric layer arranged above the main surface with the metal layers embedded in the dielectric layer, a further dielectric layer arranged above the further main surface with the further metal layer arranged in or on the further dielectric layer, and an integrated circuit in the interposer, the integrated circuit being connected with at least one of the metal layers.

In an embodiment of the interposer-chip-arrangement, the contact pad of the chip is electrically conductively connected with the interconnection by a structured metallization.

In a further embodiment, the contact pad of the chip is electrically conductively connected with the interconnection via one of the metal layers.

In a further embodiment, the contact pad of the chip is electrically conductively connected with the interconnection via the further metal layer.

In a further embodiment, the interconnection has the shape of a hollow cylinder and is filled with dielectric material.

In a further embodiment, an insulation is arranged between the interposer and the interconnection.

In a further embodiment, a cavity and a further cavity are formed in the main surface of the interposer or in the further main surface of the interposer, the cavities having different depths, the chip is arranged in the cavity, and a further chip is arranged in the further cavity.

A method of producing the interposer-chip-arrangement comprises providing an interposer with an integrated circuit, arranging a dielectric layer with metal layers embedded in the dielectric layer above a main surface of the interposer, connecting the integrated circuit with at least one of the metal layers, forming an interconnection through the interposer, the interconnection contacting one of the metal layers, arranging a further dielectric layer above a further main surface of the interposer opposite the main surface with a further metal layer arranged in or on the further dielectric layer, the further metal layer being connected with the interconnection, arranging a chip provided with at least one contact pad at the main surface or at the further main surface, and electrically conductively connecting the contact pad with the interconnection.

In a variant of the method, a structured metallization is applied to connect the contact pad with the interconnection.

In further variants of the method, the contact pad is connected with the interconnection via one of the metal layers or via the further metal layer.

In a further variant of the method, a cavity is formed in the interposer, and the chip is arranged in the cavity.

In a further variant of the method, a further cavity is formed in the interposer, and a further chip provided with at least one contact pad is arranged in the further cavity, so that the contact pads of the chips are at the same level.

In a further variant of the method, the interconnection is formed in the shape of a hollow cylinder and is filled with dielectric material.

The following is a detailed description of embodiments of the interposer-chip-arrangement and of intermediate products of examples of the method.

DETAILED DESCRIPTION

Figure 1:
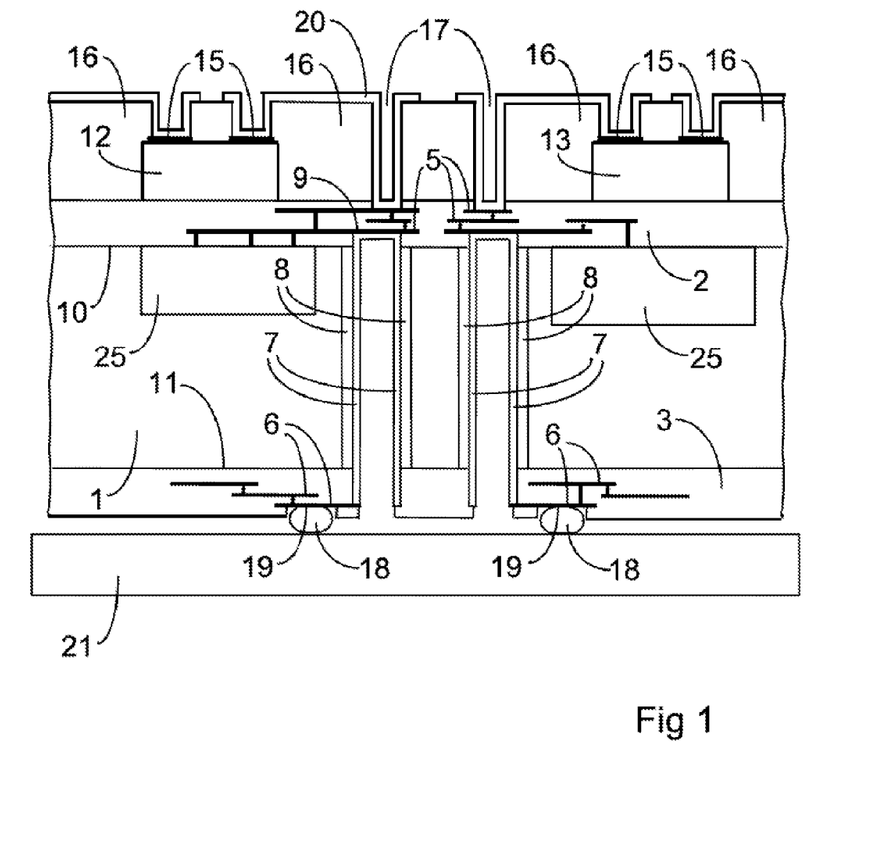
FIG. 1 is a cross section of an embodiment of the interposer-chip-arrangement.

FIG. 1 is a cross section of an embodiment of the interposer-chip-arrangement. The interposer 1, which may be semiconductor material, especially a silicon wafer, for instance, has a main surface 10 and a further main surface 11 opposite the main surface. A dielectric layer 2, which may be an oxide of the semiconductor material, for instance, is arranged above the main surface 10. Structured and interconnected metal layers 5 are embedded in the dielectric layer 2. An integrated circuit 25 is arranged in the interposer 1 and is connected with at least one of the metal layers 5, which can be provided as a wiring of the integrated circuit 25. A further dielectric layer 3 is arranged above the further main surface 11 with at least one further metal layer 6 embedded in the further dielectric layer 3.

An electrically conductive interconnection 7 through the interposer 1 connects one of the metal layers 5 and the further metal layer 6. The interconnection 7 can be formed by a metallization, which is arranged in a via hole and may be electrically insulated from the material of the interposer 1 by an insulation 8 at the sidewall of the via hole. The metallization of the interconnection 7 is applied on a contact area 9 of the relevant metal layer 5. The interconnection 7 can be formed as an open through-substrate via in the shape of a hollow cylinder surrounding an inner volume, which may be filled with dielectric material, for instance.

A chip 12 comprising at least one contact pad 15 is arranged on or above the dielectric layer 2. The contact pad is electrically conductively connected with the interconnection 7 by means of a structured metallization 20, which is applied on the contact pad 15 and on a metal layer 5 that is electrically conductively connected with the interconnection 7. Instead of the structured metallization 20, bond wires may be applied to connect the contact pad 15 with the metal layer 5. A cover layer 16 may be applied on the dielectric layer 2 and on the chip 12. The cover layer 16 is provided with openings 17 above the contact pad 15 and above the metal layer 5 to enable the electrical connection.

The further metal layer 6 can be provided as a redistribution layer or as part of a further wiring, for instance. A further contact area 19 on the further metal layer 6 can be provided with a bump contact 18, which can be a solder ball, for instance. The bump contact 18 serves as an external electrical connection, in particular as a connection with conductor tracks or the like when the interposer-chip-arrangement is mounted on a carrier like a printed circuit board 21, for instance.

A method for producing the interposer-chip-arrangement is described in the following in conjunction with FIGS. 2 to 5, which show cross sections of intermediate products. Elements corresponding to similar elements of the embodiment according to FIG. 1 are designated with the same reference numerals.

Figure 2:
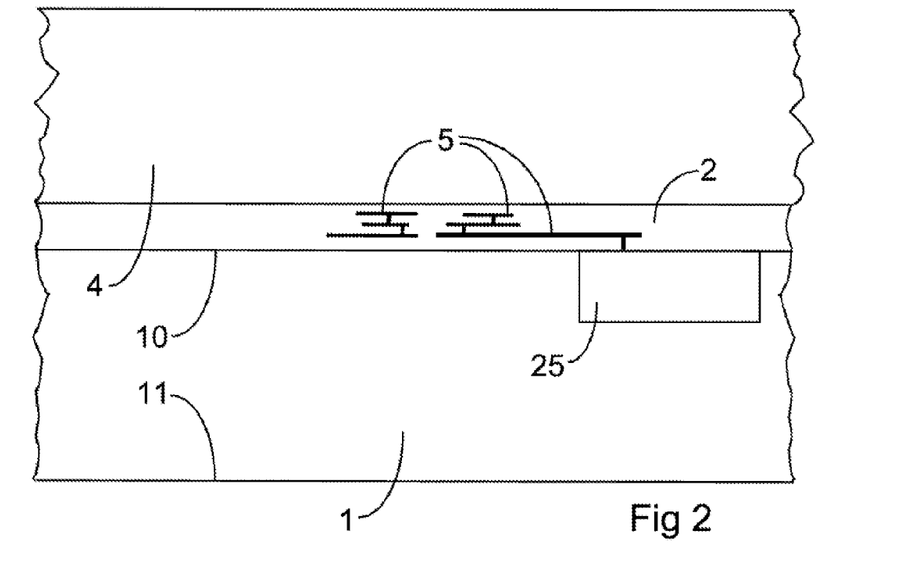
FIG. 2 is a cross section of an intermediate product of a method of producing the interposer-chip-arrangement.

FIG. 2 is a cross section of the interposer 1 with the dielectric layer 2 and embedded metal layers 5 on its main surface 10. An integrated circuit 25 is connected to the metal layers 5, which serve as a wiring. Manufacture is facilitated if a handling wafer 4 is fastened to the upper surface of the dielectric layer 2. The interconnection 7 is produced from the further main surface 11 of the interposer 1, opposite the dielectric layer 2.

Figure 3:
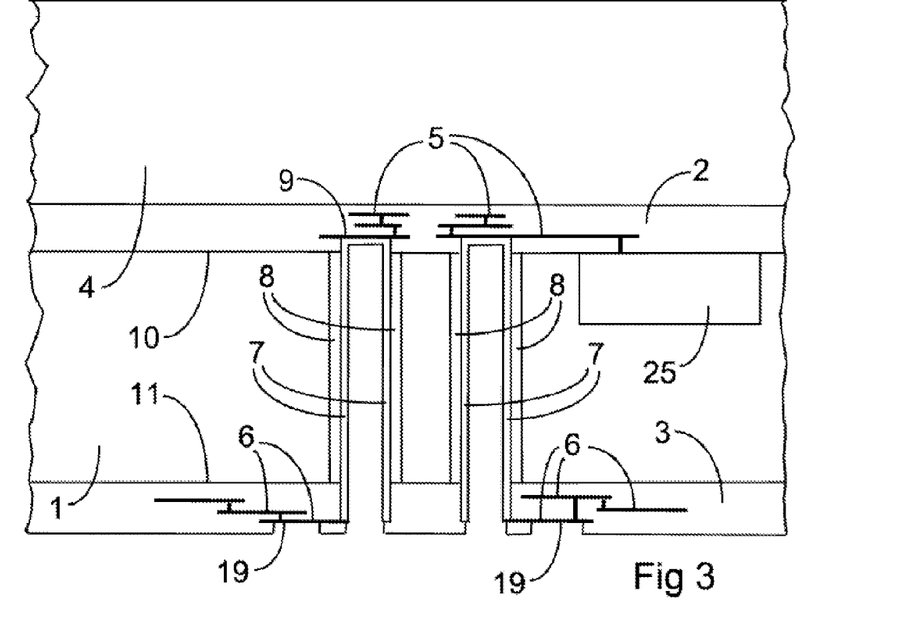
FIG. 3 is a cross section according to FIG. 2 after the formation of through-substrate-vias.

FIG. 3 is a cross section according to FIG. 2 after the formation of the interconnection 7. The further dielectric layer 3 is arranged above the further main surface 11. The interconnection 7 can be produced by etching a via hole through the further dielectric layer 3 and the interposer 1, until a contact area 9 of one of the metal layers 5 is uncovered. A sidewall insulation 8 may be formed in the via hole, and a metallization is applied in the via hole, so that the metallization electrically contacts the contact area 9. The metallization yields the electrically conductive interconnection 7. At least one further metal layer 6, which is connected to the interconnection 7, is arranged in or on the further dielectric layer 3. The inner volume of the interconnection 7 can be filled with the material that is applied to form the further dielectric layer 3, which may be an oxide or nitride of semiconductor material, for instance. A further contact area 19 of the further metal layer 6 can be provided for an external electrical connection. The handling wafer 4 is then removed.

Figure 4:
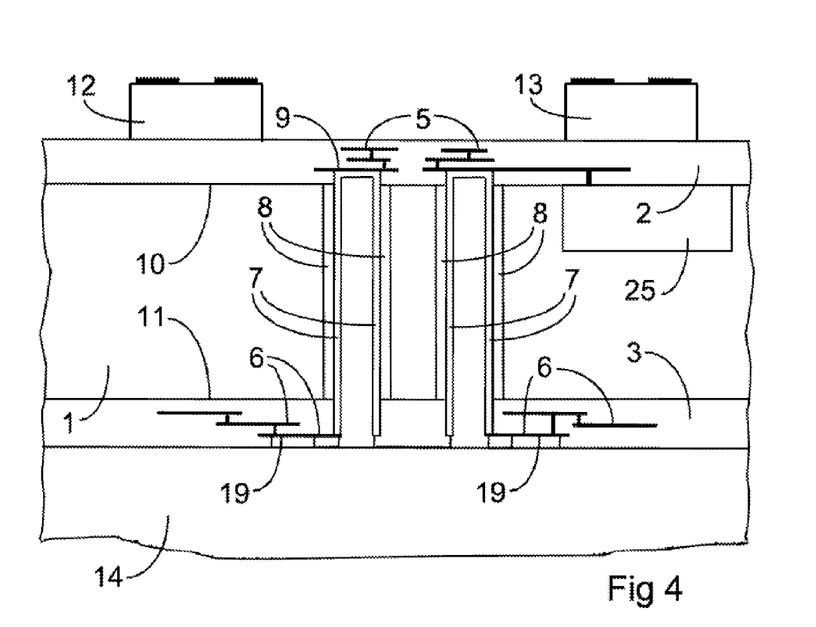
FIG. 4 is a cross section according to FIG. 3 after the placement of chips.

FIG. 4 is a cross section according to FIG. 3 after the placement of chips. Manufacture is facilitated if a further handling wafer 14 is fastened to the further dielectric layer 3. A chip 12 and a further chip 13 are mounted on the dielectric layer 2. Any number of chips can thus be mounted above the main surface 10. Chips and integrated circuits 25 of the interposer 1 may especially be arranged in one-to-one correspondence to form a plurality of device units.

Figure 5:
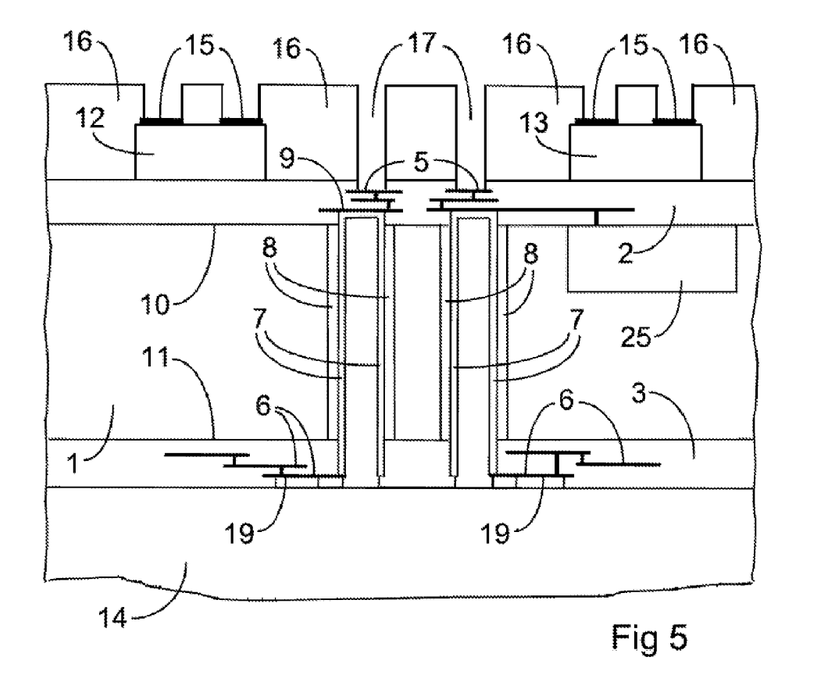
FIG. 5 is a cross section according to FIG. 4 after the application of a cover layer provided with openings.

FIG. 5 is a cross section according to FIG. 4 after the application of a planarizing cover layer 16, which may be a polymer, for instance, in particular a photosensitive organic polymer. Openings 17 are formed in the cover layer 16 above contact pads 15 of the chips 12, 13 and above the metal layers 5 in order to allow the contact pads 15 to be electrically connected with one of the metal layers 5 and thus with the interconnection 7. The electrical connection can be formed by an application of a structured metallization 20 as shown in FIG. 1 or by an application of bond wires, which are known per se. After removal of the further handling wafer 14, a bump contact 18 can be applied on the further contact area 19, and the interposer-chip-arrangement according to FIG. 1 is obtained.

Figure 6:
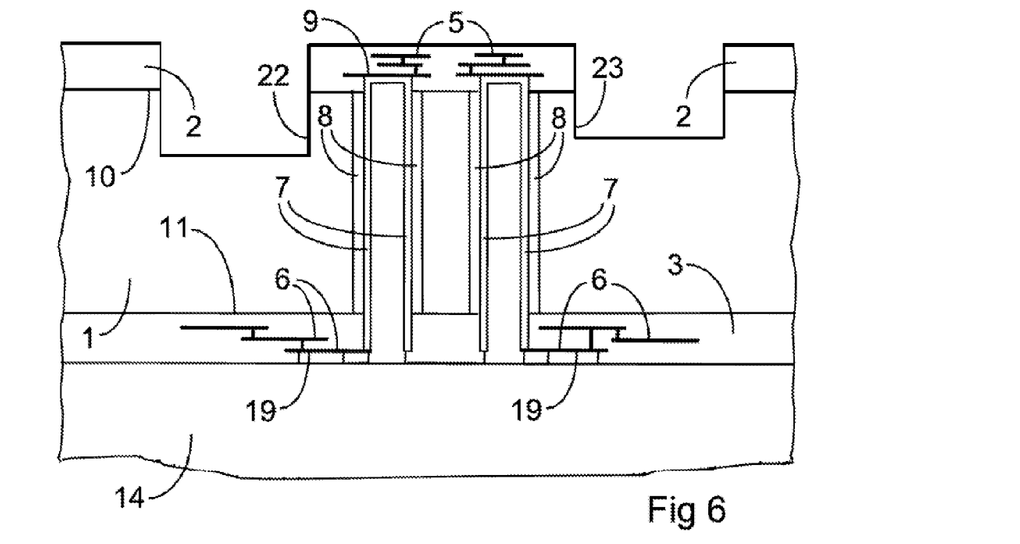
FIG. 6 is a cross section according to FIG. 3 after the formation of chip cavities for a further embodiment.

FIG. 6 is a cross section according to FIG. 3 after the formation of chip cavities for a further embodiment. Elements corresponding to similar elements of the embodiment according to FIG. 3 are designated with the same reference numerals. After the removal of the handling wafer 4, a further handling wafer 14 may be fastened to the dielectric layer 3. Cavities 22, 23 are formed in the dielectric layer 2 and in the interposer 1. The cavities 22, 23, which are provided for the accommodation of chips, can be produced by etching and may have different depths. It may be suitable to arrange the cavities 22, 23 outside the region occupied by the integrated circuit 25, which is hence not shown in FIG. 6.

Figure 7:
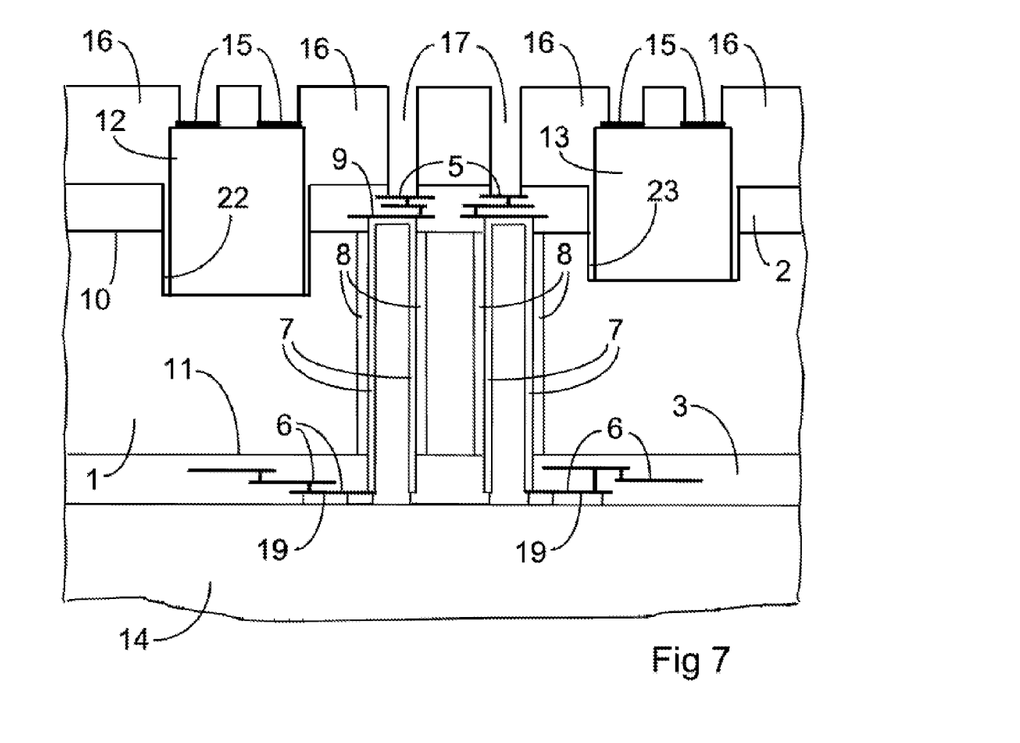
FIG. 7 is a cross section according to FIG. 6 after the placement of chips.

FIG. 7 is a cross section according to FIG. 6 after the placement of chips. A chip 12 is arranged in the cavity 22, and a further chip 13 is arranged in the further cavity 23. In the embodiment shown in FIG. 7, the chips 12, 13 have different sizes, and the depths of the cavities 22, 23 are different, so that the contact pads 15 of the chips 12, 13 are at the same level. The cavities 22, 23 can thus be adapted to the sizes of the chips 12, 13. Instead, the cavities 22, 23 can each have the same depth and the same lateral dimensions. The chips 12, 13 can be mounted in the cavities 22, 23 by means of an adhesive, for instance. If the interposer 1 is a semiconductor material, the chips 12, 13 can instead be fastened by a bonding process, which is known per se. If a bonding method is applied, the bottom of the cavity has to be sufficiently plain. This can be achieved by providing an etch stop layer in the interposer 1 at the position where the bottom of a cavity is to be formed.

Figure 8:
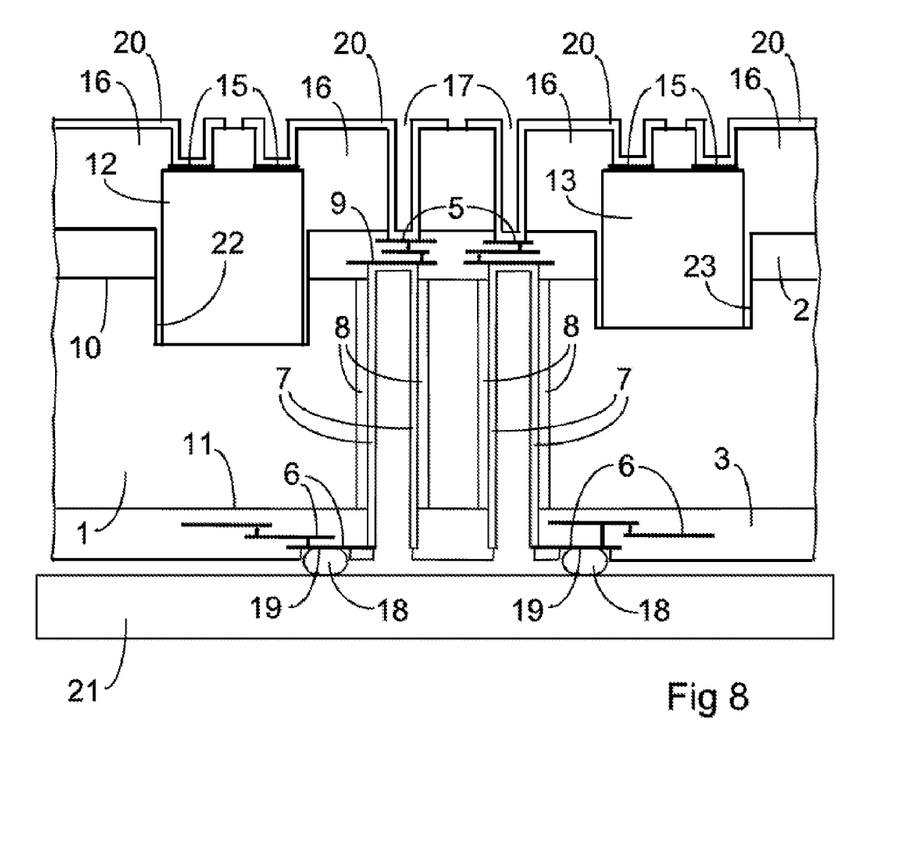
FIG. 8 is a cross section according to FIG. 7 after the application of a metallization.

FIG. 8 is a cross section according to FIG. 7 after the application of a structured metallization 20, which connects areas of the contact pads 15 and the metal layers 5, which are uncovered in the openings 17 of the cover layer 16. After removal of the further handling wafer 14, a bump contact 18 may be applied on the further contact area 19 of the further metal layer 6 according to the embodiment shown in FIG. 1, and the interposer-chip-arrangement can be mounted on a printed circuit board 21.

Figure 9:
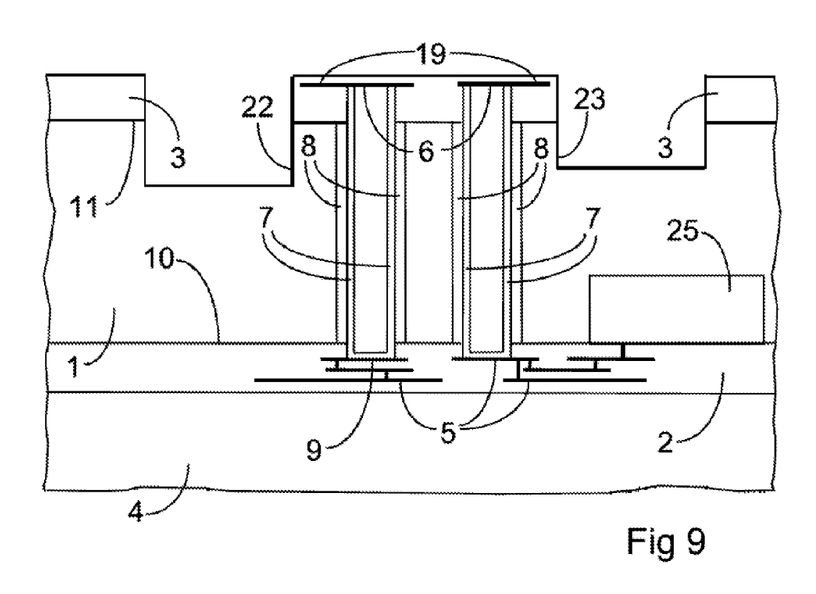
FIG. 9 is a cross section according to FIG. 6 for a further embodiment.

FIG. 9 is a cross section according to FIG. 6 for a further embodiment comprising cavities for the chips. Elements corresponding to similar elements of the embodiment according to FIG. 6 are designated with the same reference numerals. In the embodiment according to FIG. 9, the cavities 22, 23 are formed in the further dielectric layer 3 and in the further main surface 11 of the interposer 1. The cavities 22, 23 and the integrated circuits 25 are located on opposite sides of the interposer 1. The cavities 22, 23 can be produced by etching like the via hole that is provided for the interconnection 7. The further contact areas 19 of the further metal layer 6 are provided for a connection of the contact pads 15 of the chips 12, 13 with the corresponding interconnections 7.

Figure 10:
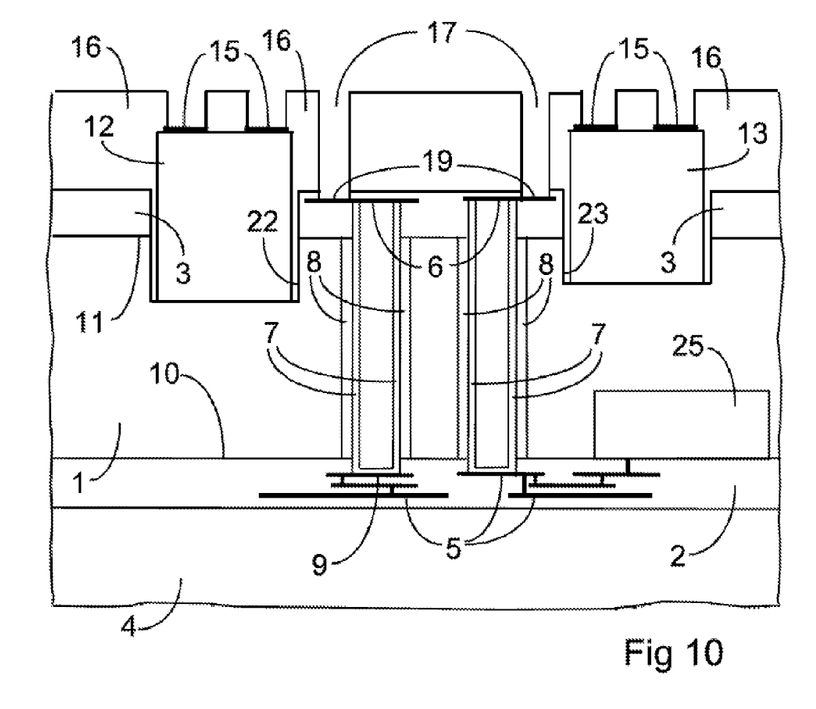
FIG. 10 is a cross section according to FIG. 9 after the placement of chips.

FIG. 10 is a cross section according to FIG. 9 after the placement of the chip 12 in the cavity 22 and the further chip 13 in the further cavity 23. In the embodiment shown in FIG. 10, the chips 12, 13 have different sizes, and the depths of the cavities 22, 23 are adapted so that the contact pads 15 of the chips 12, 13 are at the same level. The cavities 22, 23 can thus be adapted to the sizes of the chips 12, 13. The cavities 22, 23 can instead each have the same dimensions. The chips 12, 13 can be mounted in the cavities 22, 23 by means of an adhesive, for instance. If the interposer 1 is a semiconductor material, the chips 12, 13 can instead be fastened by a bonding process. A cover layer 16, which may be a polymer, may be applied on the further dielectric layer 3 and on the chip 12. The cover layer 16 is provided with openings 17 above the contact pads 15 and above the further contact areas 19 of the further metal layer 6.

Figure 11:
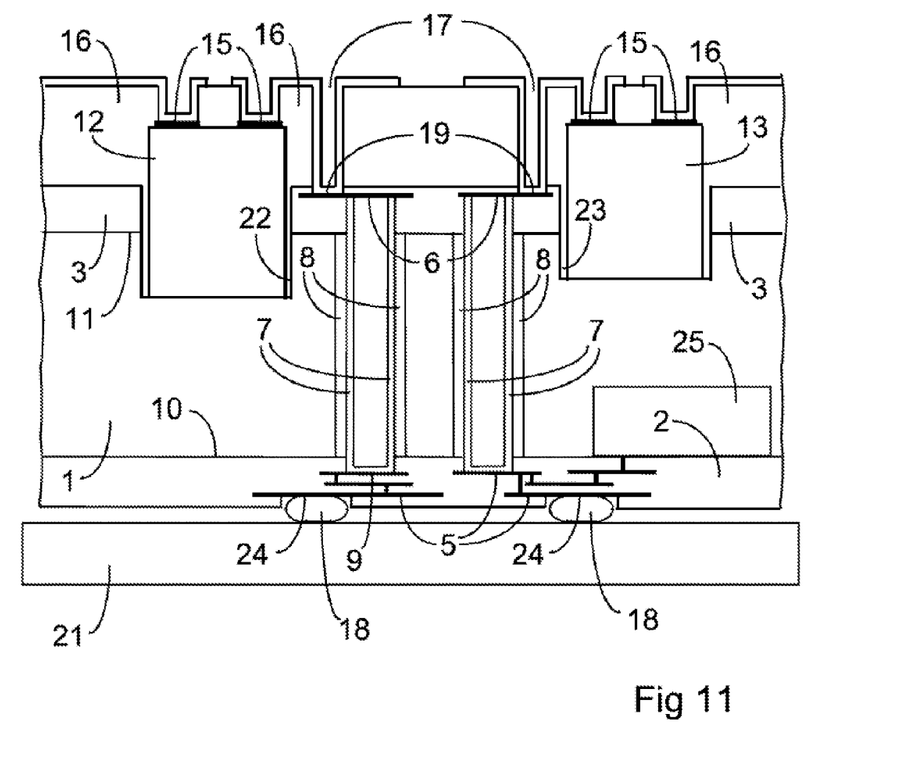
FIG. 11 is a cross section according to FIG. 10 after the application of a metallization.

FIG. 11 is a cross section according to FIG. 10 after the application of a structured metallization 20, which connects the contact pads 15 and the further contact areas 19 of the further metal layer 6 in the openings 17 of the cover layer 16. After removal of the handling wafer 4, bump contacts 18 may be applied on the further contact areas 24 of the metal layers 5 according to the embodiment shown in FIG. 8, and the interposer-chip-arrangement can be mounted on a printed circuit board 21.

Figure 12:
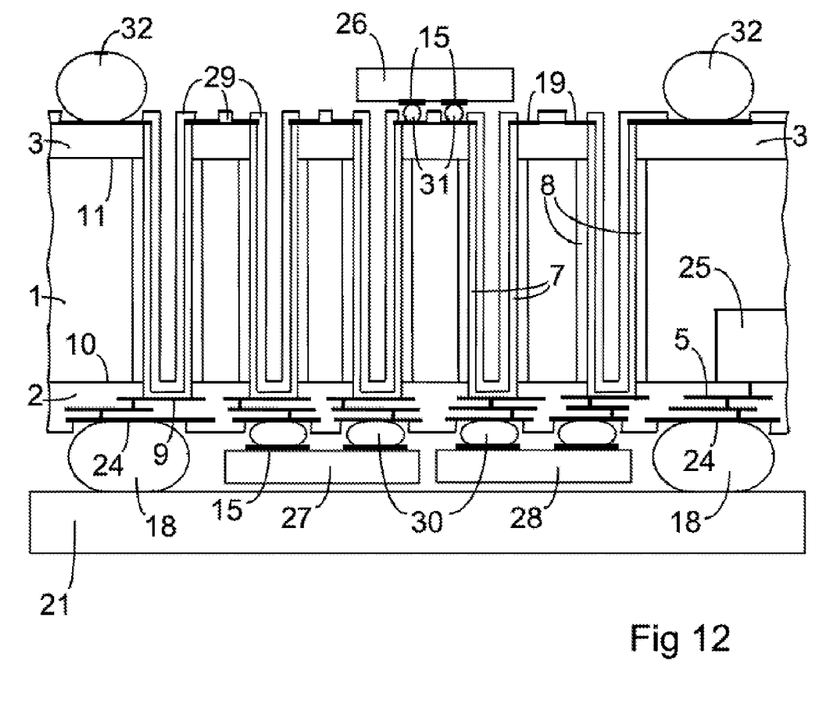
FIG. 12 is a cross section according to FIG. 11 for a further embodiment comprising chips mounted in flip-chip technology.

FIG. 12 is a cross section according to FIG. 11 for a further embodiment comprising chips mounted in flip-chip technology. Elements corresponding to similar elements of the embodiment according to FIG. 11 are designated with the same reference numerals. In the embodiment according to FIG. 12, the interposer-chip-arrangement is provided with bump contacts 18 arranged on the further contact areas 24 above the main surface 10 of the interposer 1. In FIG. 12 the interposer-chip-arrangement is shown after it has been mounted on a printed circuit board 21 using the bump contacts 18. The contact areas 9 above the main surface 10 are connected by interconnections 7 with the further contact areas 19 above the further main surface 11. The further contact areas 19 can be provided with further bump contacts 32, which can be connected with contact pads of a further interposer or printed circuit board, for example.

Above the further main surface 11, a chip 26 is arranged with its contact pads 15 connected to further contact areas 19 of the interposer 1 in order to connect the contact pads 15 electrically conductively with interconnections 7 of the interposer 1. The connections between the contact pads 15 and the corresponding further contact areas 19 can be provided by bump contacts 31 in flip-chip-technology. Above the main surface 10, further chips 27, 28 can be arranged with their contact pads 15 connected to further contact areas 24 of the interposer 1. These connections can also be provided by bump contacts 30 in flip-chip-technology. The further chips 27, 28 are thus arranged between the interposer 1 and the printed circuit board 21. There may be any number of chips 26, 27, 28 mounted in this way by means of bump contacts 30, 31.

An interconnection 7 can serve to connect bump contacts 18 and further bump contacts 32 of the interposer-chip-arrangement in order to provide an electrical connection through the interposer 1. An interconnection 7 can instead or additionally serve to connect a contact pad 15 of one of the mounted chips 12, 13, 26, 27, 28 with any further contact pad 15 of any of the mounted chips 12, 13, 26, 27, 28.

The described interposer-chip-arrangement allows a reduction of the lateral and vertical dimensions of the chip package. Extremely flat and small wafer level packages are obtained by means of interconnections formed like through-substrate vias connecting redistribution metal layers on opposite sides of the interposer. The integrated circuit of the interposer yields an especially dense arrangement of the circuitry, additionally to the circuit components that are provided by the mounted chips.

We claim:

1. An interposer-chip-arrangement, comprising:
   an interposer of semiconductor material, the interposer having a main surface and a further main surface opposite the main surface;
   a dielectric layer arranged on or above the main surface;
   metal layers embedded in the dielectric layer, the metal layers comprising contact areas;
   a further dielectric layer arranged on or above the further main surface;
   a further metal layer arranged in or on the further dielectric layer, the further metal layer comprising further contact areas;
   electrically conductive interconnections through the interposer, each of the interconnections connecting one of the contact areas with the further metal layer;
   a cavity in the further main surface;
   a further cavity in the further main surface, the cavity and the further cavity having different depths;
   a chip arranged in the cavity, the chip comprising a contact pad;
   a further chip arranged in the further cavity, the further chip comprising a further contact pad;
   the contact pad and the further contact pad each being electrically conductively connected with one of the further contact areas; and
   the interposer being provided with an integrated circuit, the integrated circuit being arranged at the main surface and being connected with at least one of the metal layers,
   wherein the chip and the further chip are mounted in the cavity and the further cavity by an adhesive or by bonding.

2. The interposer-chip-arrangement according to claim 1, wherein at least one of the interconnections has the shape of a hollow cylinder and is filled with dielectric material.

3. The interposer-chip-arrangement according to claim 1, further comprising:
   an insulation arranged between the interposer and at least one of the interconnections.

* * * * *